(12) United States Patent
Toda et al.

(10) Patent No.: US 7,374,446 B2
(45) Date of Patent: May 20, 2008

(54) IC SOCKET

(75) Inventors: Shinsaku Toda, Kanagawa (JP); Shuji Kajinuma, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 0 days.

(21) Appl. No.: 11/749,736

(22) Filed: May 16, 2007

(65) Prior Publication Data

US 2007/0212917 A1 Sep. 13, 2007

Related U.S. Application Data

(63) Continuation-in-part of application No. 11/558,789, filed on Nov. 10, 2006, now abandoned.

(30) Foreign Application Priority Data

Apr. 14, 2004 (JP) .............................. 2004-119472

(51) Int. Cl.
*H01R 13/625* (2006.01)
*H01R 13/62* (2006.01)

(52) U.S. Cl. ...................................... 439/342; 439/331

(58) Field of Classification Search ................ 439/342, 439/341, 940, 70, 526, 527, 345, 353, 330, 439/71, 73
See application file for complete search history.

(56) References Cited

U.S. PATENT DOCUMENTS

| 4,502,747 A | 3/1985 | Bright et al. |
| 5,344,334 A | 9/1994 | Laub et al. |
| 5,707,247 A | 1/1998 | Konstad |
| 6,155,859 A | 12/2000 | Choy |
| 6,485,321 B1 | 11/2002 | Trout et al. |
| 6,881,088 B2 | 4/2005 | Gattuso et al. |
| 6,971,902 B2 | 12/2005 | Taylor et al. |
| 7,161,805 B2 | 1/2007 | Gattuso et al. |
| 2005/0014400 A1 | 1/2005 | Liao et al. |
| 2005/0202708 A1 | 9/2005 | Hashimoto |

FOREIGN PATENT DOCUMENTS

| JP | 62-278778 | 12/1987 |
| JP | 2001-241035 | 9/2001 |
| WO | 2007-043270 | 4/2007 |

*Primary Examiner*—Chandrika Prasad
(74) *Attorney, Agent, or Firm*—Barley Snyder LLC

(57) ABSTRACT

There is provided an IC socket for an IC package having plural pads disposed in a matrix manner on the lower face thereof, on which the IC package can be loaded with a small number of operations, and after the loading, the electrical connection between the pads and contacts can be ensured. The IC socket includes: a load support member having both side walls each provided with guide grooves having cam surfaces; a pressure application cover changing position between a load position which applies load to an IC package thereby pressing the pads against elastic contacts and a no-load position, and having nail sections sliding along the cam surfaces in the guide grooves; a lever including a crankshaft section causing the nail sections to slide along the cam surfaces in the guide grooves thereby causing the pressure application cover to change position between the load position and the no-load position.

26 Claims, 13 Drawing Sheets

WIDTH DIRECTION →
DEPTH DIRECTION ↓

← WIDTH DIRECTION

IC SOCKET

RELATED APPLICATION DATA

This is a continuation-in-part application of U.S. patent application Ser. No. 11/558,789, filed Nov. 10, 2006, now abandoned, which claims the benefit of U.S. Ser. No. 11/105,639, filed Apr. 14, 2005, abandoned.

FIELD OF THE INVENTION

The present invention relates to an IC socket including an insulation housing which has a mounting surface for mounting the lower face of an IC package, and a plurality of elastic contacts electrically connected to a substrate and provided corresponding to a plurality of pads disposed in a matrix manner on the lower face of the IC package.

BACKGROUND OF THE INVENTION

There are various types of IC packages having a semiconductor element packaged therein, including a type called LGA (Land Grid Array) having tabular pads disposed on the lower face thereof, a type called BGA (Ball Grid Array) having spherical pads disposed on the lower face thereof, and a type called PGA (Pin Grid Array) having lead pins disposed on the lower face thereof. When an IC package of the aforementioned types is electrically connected to the wiring on a circuit board, an IC socket is conventionally employed. The IC socket includes an insulation housing which has a mounting surface on which the IC package mounts and contacts electrically connected to the wiring on the circuit board arranged thereon.

A known IC socket LGA or BGA type IC packages includes a pressure application cover positioned on the upper face of the IC package and a pair of stoppers which press the pressure application cover against the IC package (for example, refer to Japanese Patent Laid-Open No. 2001-251035). In order to load the IC package on this IC socket, the IC package must be placed on the mounting surface, and then the pressure application cover must be set on the IC package, and further, each of the stoppers must be manipulated to press the pressure application cover. Specifically, three operations in all, (i.e. the setting of the pressure application cover, and the manipulation of each of the pair of stoppers) must be performed, thus increasing labor.

A known IC socket for a PGA type IC package includes a lever for sliding the mounting surface of the IC package (for example, refer to Japanese Patent Publication No. 62-278778). The contact of this IC socket has a pair of arms sandwiching a lead pin of the IC package therebetween. The lever is manipulated to slide the mounting surface to thereby insert the lead pin between the pair of arms. Accordingly, loading the IC package on this IC socket can be performed by a single operation that places the IC package on the mounting surface and then manipulates the lever. Thus, a pressure application cover, such as is provided in the aforementioned socket for an LGA or PGA type connector to press the pad of the IC package against the contact, is not needed. On the other hand, in an IC package of LGA type and an IC package of BGA type, the terminal (pad) electrically connected to the contact is shorter than the terminal (lead pin) of an IC package of PGA type. Therefore, in order to ensure the electrical connection between the terminal and contact, it is preferable that the terminal is pressed against the contact by means of the pressure application cover.

Consequently, a direct application of the technique described in patent document 2 for a socket for IC package with pads can pose a problem in ensuring the electrical connection between the pad and contact. In addition, in the IC socket for a PGA type package, when the mounting surface of the IC package is slid by means of the lever, a load is applied by the lever to the insulation housing in a different direction from the pressing direction by the pressure application cover, which is unsuitable for an IC socket with the pressure application cover.

SUMMARY OF THE INVENTION

The present invention has been made in view of the above circumstances and provides an IC socket on which an IC package can be loaded with a small number of operations, and after the loading, the electrical connection between the pad and contact can be ensured.

An IC socket according to the invention has an insulation housing which has a mounting surface mounting the lower face of an IC package, and has disposed therein elastic contacts electrically connected to a substrate and provided corresponding to pads of the IC package, the IC package having the plurality of pads disposed in a matrix manner on the lower face thereof. The IC socket includes: a load support member having a base section attached on a bottom face side of the insulation housing, and both side walls rising from the base section along opposing side walls of the insulation housing and each provided with a guide groove with a cam surface; a pressure application cover positioned on an upper face side of the IC package, having a nail section sliding along the cam surface in the guide groove and changing in position between a load position which applies load to the IC package to thereby press the pads against the elastic contacts and a no-load position which applies no load to the IC package; and a lever rotatably supported on the both side walls of the load support member, including a crankshaft section which causes the nail section to slide along the cam surface in the guide groove to thereby cause the pressure application cover to change in position between the load position and the no-load position, and an actuating shaft section substantially orthogonal to the crankshaft section.

The IC socket according to the invention includes the pressure application cover which takes the load position which presses the pads against the elastic contacts. Thus, after the loading of the IC package, the electrical connection between the pads and contacts can be ensured. Also, according to the inventive IC socket, the both side walls of the load support member and the pressure application cover are provided with the cam mechanism which causes the load support member to change in position from the no-load position to the load position. Accordingly, the IC package can be loaded via a cam action by a single operation of manipulating the lever after setting the IC package with the pressure application cover in the no-load position.

It is noted here that the insulation housing is disposed off the rotation range of the crankshaft section of the lever so as to prevent the crankshaft section from applying load to the insulation housing, whereby the position of the pressure application cover can be changed with a small actuating power.

According to a preferred aspect of the invention, when changing in position between the load position and no-load position, the pressure application cover goes through a predetermined intermediate position to change position; the guide groove provided in each of the both side walls of the load support member has a first guide groove having a first cam surface, and a second guide groove having a second cam surface; and the nail section has a first nail section which slides along the first cam surface in the first guide groove when the pressure application cover changes position between the no-load position and intermediate position, and a second nail section which slides along the second cam surface in the second guide groove when the pressure application cover changes position between the intermediate position and load position.

According to this aspect, the cam action is divided into two steps, thereby preventing the cam mechanism from getting bigger while securing a sufficient stroke of the cam surface.

According to another preferred aspect of the invention, the IC socket includes a guide member disposed between the insulation housing and pressure application cover and having a pair of guide rails which guide the IC package.

This enables the IC package to be guided to the proper position, thus preventing damages on the elastic contacts and insulation housing caused by improperly loading the IC package.

According to the invention, it is possible to provide the IC socket in which an IC package can be loaded with a small number of operations, and after the loading, the electrical connection between the pad and contact can be ensured.

DETAILED DESCRIPTION OF THE EMBODIMENT(S)

An embodiment of the invention will be described below with reference to the drawings.

Figure 1:
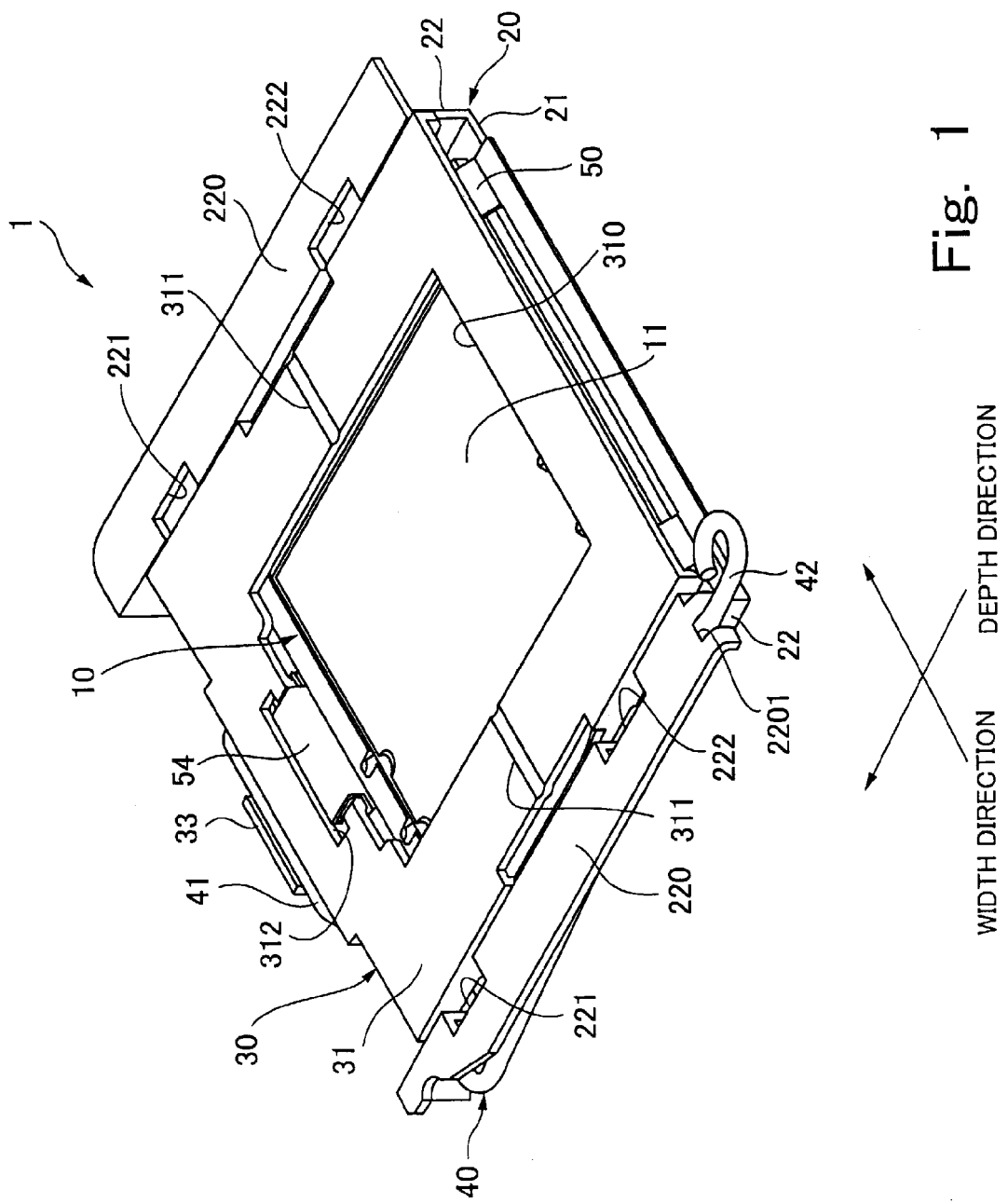
FIG. 1 is a perspective view showing an IC socket according to an exemplary embodiment of the present invention.

An IC socket 1, shown in FIG. 1, is a socket for an LGA (Land Grid Array) type IC package (not shown), which has a plurality of tabular pads disposed in a matrix manner on the lower face thereof. The front right side in the FIG. 1 (referred to herein as the backside) is the IC package receiving side. Hereinafter, a direction extending from the front right side to the back left side is referred to as the depth direction of the IC package 1, and a direction extending from the front left side to the back right side is referred to as the width direction of the IC package 1. The depth direction of the IC package 1 is orthogonal to the width direction of the IC package 1. The IC socket 1 includes an insulation housing 10, a load support member 20, a pressure application cover 30, a lever 40, and a guide member 50. The insulation housing 10, which may, for example, be formed of a suitable plastic material, has a mounting surface 11 for mounting an IC package (not shown). On the mounting surface 11, there are disposed elastic contacts 111 shown in FIG. 2.

Figure 2:
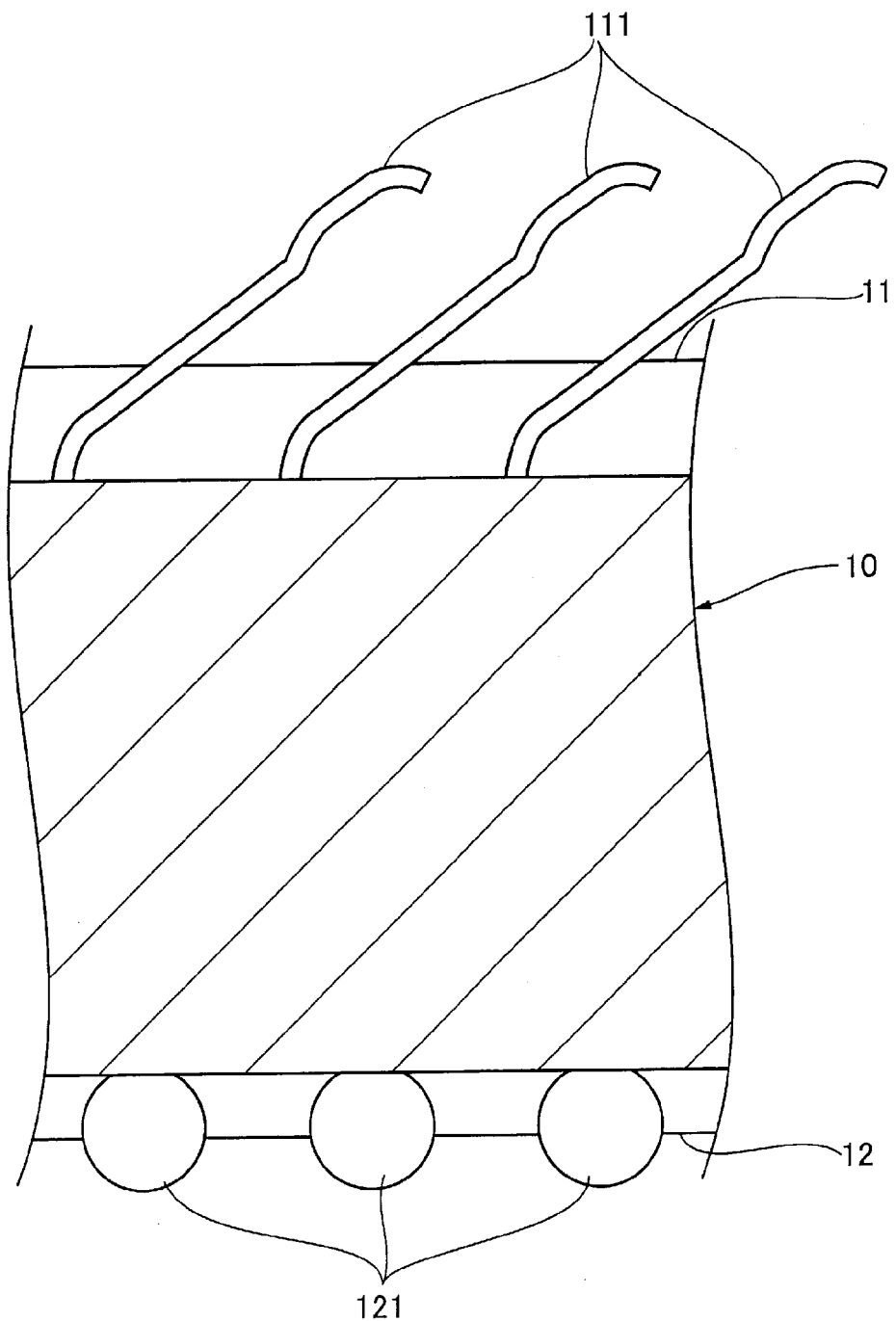
FIG. 2 is a diagram schematically showing elastic contacts disposed on the mounting surface of the IC socket shown in FIG. 1.

The elastic contacts 111 shown in FIG. 2 are provided corresponding to a plurality of pads of the IC package (not shown). The elastic contacts 111 have an elongate shape, with a free tip end thereof extending obliquely upward from the insulation housing 10. In the IC socket 1 shown in FIG. 1, the pads of the IC package (not shown) are pressed from an upper direction of FIG. 2 against the tip ends of the elastic contacts 111, whereby the elastic contacts 111 bend downward in FIG. 2, thus ensuring the electrical connection between the pads and elastic contacts 111.

Also, referring to FIG. 2, solder balls 121 are illustrated on a substrate connection surface 12 of the insulation housing 10, which is positioned opposite the mounting surface 11. The elastic contacts 111 and solder balls 121 are electrically connected to each other; the solder balls 121 are soldered to a substrate circuit (not shown) so that the elastic contacts 111 are electrically connected to the substrate circuit.

Figure 3:
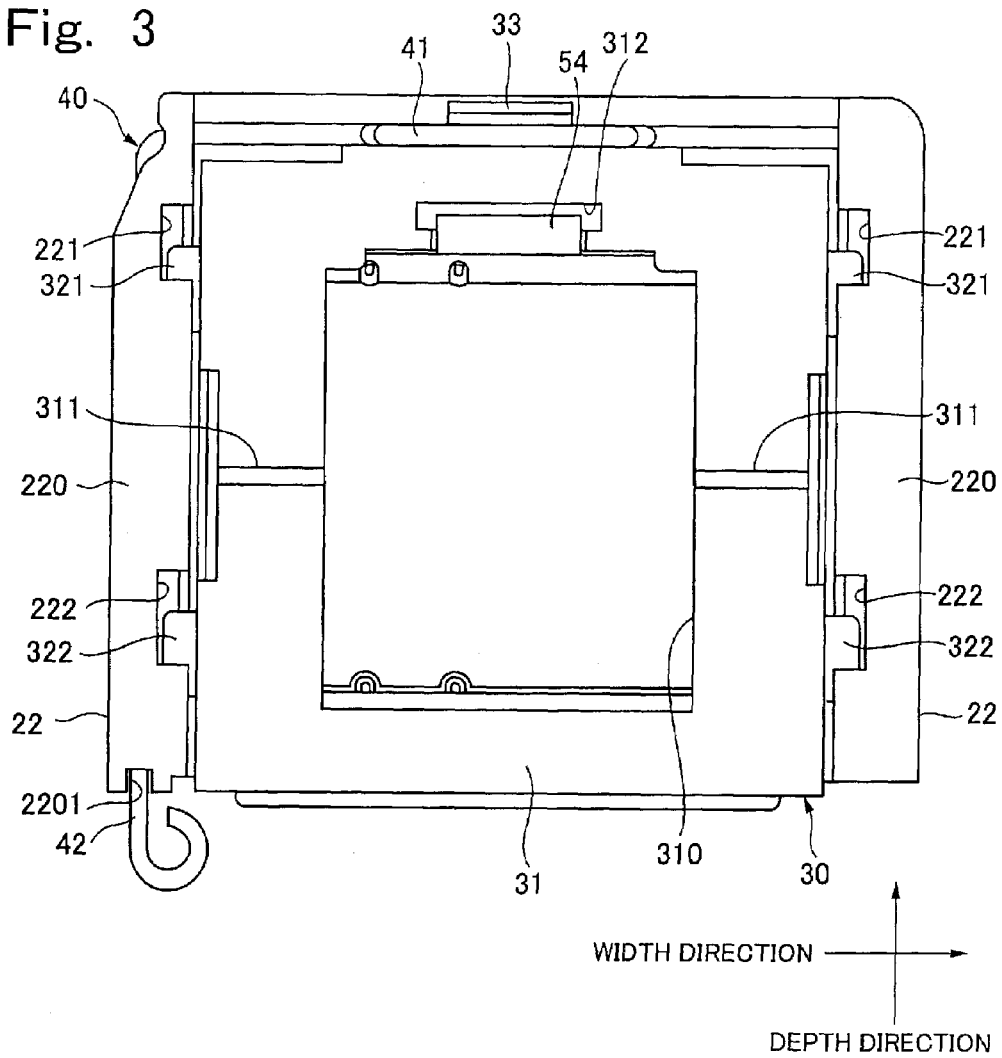
FIG. 3 is a plan view of the IC socket shown in FIG. 1 viewed from the mounting surface side.
Figure 4:
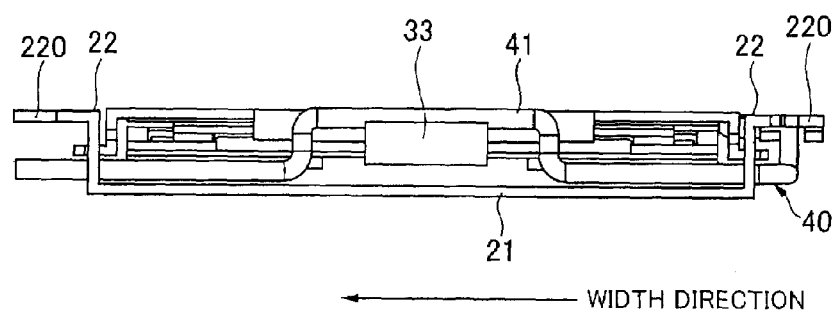
FIG. 4 is a back view of the IC socket shown in FIG. 1.

The IC socket 1 according to an exemplary embodiment will be described below with reference to FIGS. 3 to 5 as well as FIG. 1. The lower side, as shown in FIG. 5 is the substrate circuit side.

Figure 5:
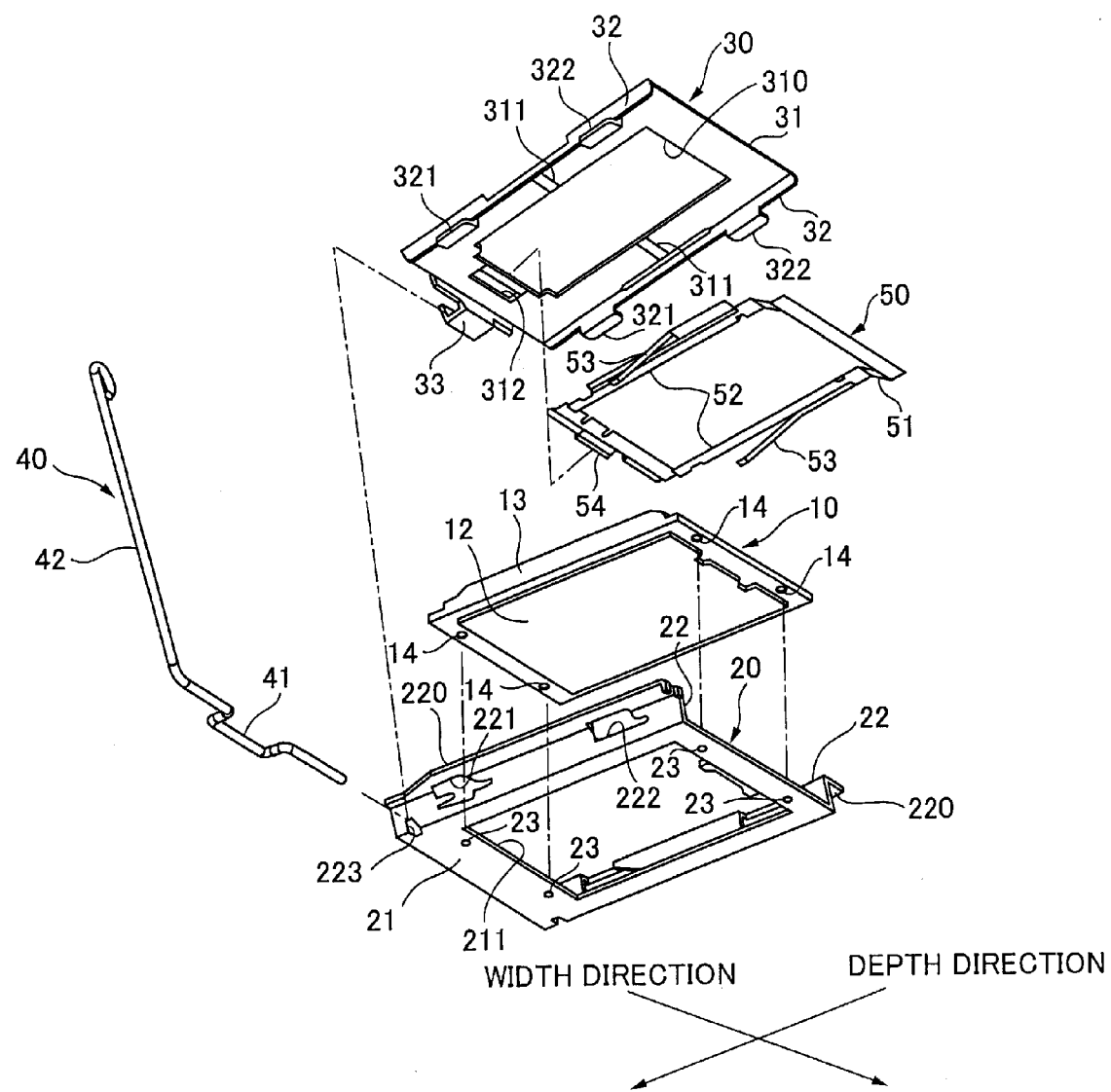
FIG. 5 is an exploded perspective view of the IC socket shown in FIG. 1.

The load support member 20 of the IC socket 1 according to the present embodiment, which may be formed by punching and bending a metal sheet, has a base section 21 and sidewalls 22 as shown in FIG. 5. The base section 21 is attached, in a manner as described later, to the bottom side of the insulation housing 10. The base section 21 has an opening 211 at the center thereof, into which the substrate connection surface 12 of the insulation housing 10 provided with the solder balls 121 shown in FIG. 2 is inserted. The sidewalls 22 are provided at both ends of the base section 21 in the width direction, respectively. Specifically, the sidewalls 22 rise from the base section 21 along the side faces 13 of the insulation housing 10 shown in FIG. 5, which face each other and extend in the depth direction. The tip end sections of the sidewalls 22 rising from the base section 21 are bent by substantially 90 degrees in opposite directions, thereby forming flange sections 220. The sidewalls 22 are provided with first guide grooves 221 and second guide grooves 222 positioned in parallel with each other. The first guide grooves 221 are disposed toward the front in the depth direction hereinafter referred to as the front side, for short) relative to the second guide grooves 222. The guide grooves 221 and 222 will be described later in details. In addition, as shown in FIG. 5, on the sidewalls 22, a lever through hole 223 supporting a lever 40 is disposed opposite the IC package receiving side (i.e., in the front side). Also, as shown in FIG. 5, the insulation housing 10 has four bosses 14 protruding toward the load support member 20. The bosses 14 are inserted into four small holes 23 provided in the base section 21 of the load support member 20, and then are subjected to thermal caulking, whereby the insulation housing 10 and load support member 20 are integrated with each other.

The pressure application cover 30, which may be formed by punching and bending a metal sheet, is disposed on the mounting surface 11 side of the insulation housing 10. The pressure application cover 30 has an upper face section 31 having an opening 310 provided at the center thereof. The upper face section 31 shown in FIG. 1 is positioned between the both sidewalls 22 of the load support member 20. At the center in the depth direction of the upper face section 31, there are provided concave sections 311 protruding toward the insulation housing 10 and extending in the width direction. Also, a slit 312 is provided in the front side of the upper face section 31 relative to the opening 310. As shown in FIG. 5, the pressure application cover 30 also has sidewall sections 32 extending from the both ends in the width direction of the upper face section 31 toward the insulation housing 10. The side wall sections 32 as shown in FIG. 5 are provided with first nail sections 321 and second nail sections 322 positioned in parallel with each other, each protruding toward the sidewalls 22 of the load support member 20 in parallel with each other. The first nail sections 321 are disposed in the front side relative to the second nail sections 322. In addition, the pressure application cover 30 also has a lever support section 33 in the front side.

The lever 40, formed by bending a metal wire rod, is rotatably supported by the lever through hole 223 disposed on the both sidewalls 22 of the load support member 20 shown in FIG. 5. The lever 40 has a crankshaft section 41 and an actuating shaft section 42 substantially orthogonal to the crankshaft section 41. The crankshaft section 41 is positioned in the backside relative to the IC package. The actuating shaft section 42 is positioned in the left side in FIG. 3, and extends from the backside to the front side in the drawing. In the flange section 220 in which the actuating shaft section 42 is positioned, there is provided a locking groove 2201 which locks the actuating shaft section 42.

As shown in FIG. 5, a guide member 50, formed by punching and bending a metal board thinner than the pressure application cover 30, is a frame-like body disposed between the insulation housing 10 and pressure application cover 30. In the IC package receiving side (the front side in the depth direction) of the guide member 50, there is provided a receiving section 51. The receiving section 51 slopes so as to distance itself from the pressure application cover 30 in a direction from the back side to the front side. The guide member 50 is also provided with a pair of guide rail sections 52 linked to the receiving section 51 and extending toward the backside. Between the pair of guide rail sections 52, there is provided a distance corresponding to the width of the IC package. In addition, in both sides in the width direction of the pair of guide rail sections 52, there are provided spring pieces 53 extending toward the back side while sloping relative to the pressure application cover 30. Also, in the back side of the guide member 50 relative to the guide rail sections 52, there is provided an engaging nail 54 which engages with the slit 312 disposed in the pressure application cover 30.

Subsequently, an assembly procedure of the IC socket 1 shown in FIG. 1 will be described. In the assembly of the IC socket 1 shown in FIG. 1, firstly the guide member 50 is installed in the pressure application cover 30, and the insulation housing 10 is integrated with the load support member 20.

Figure 6:
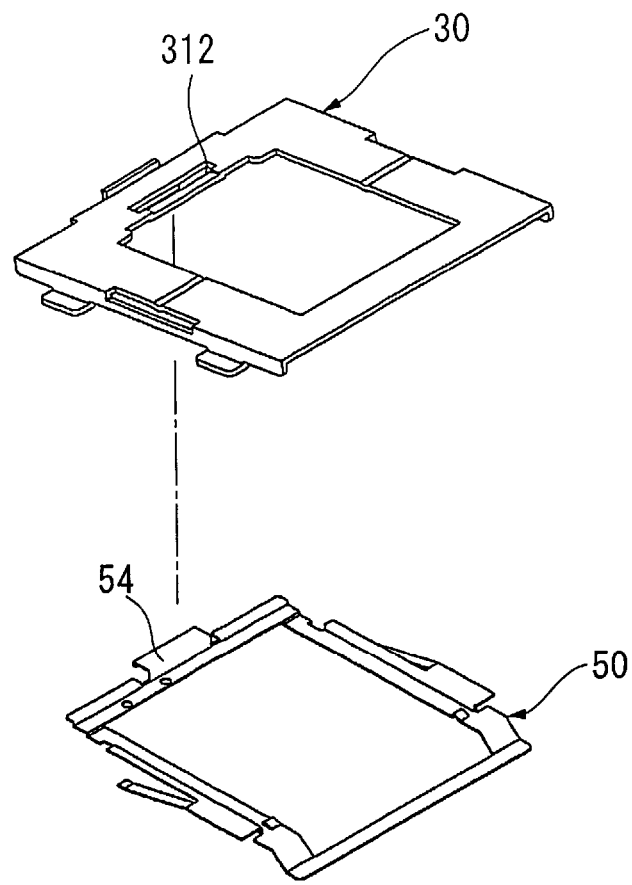
FIGS. 6a and 6b are a partial exploded view and a partial perspective view of the IC socket shown in FIG. 1, respectively, showing the installation of a guide member in a pressure application cover.
Figure 6:
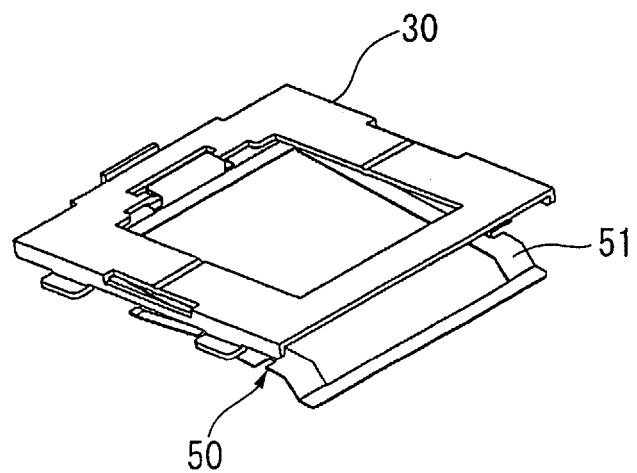

FIG. 6 is a diagram to explain the installation of the guide member in the pressure application cover.

As shown in FIG. 6(a), the pressure application cover 30 and guide member 50 are prepared, and the engaging nail 54 provided in the guide member 50 is engaged with the slit 312 provided in the pressure application cover 30. In this way, as shown in FIG. 6(b), the pressure application cover 30 with the guide member 50 installed therein can be obtained.

FIG. 7 is a diagram to explain the integration of the insulation housing with the load support member.

Figure 7A:
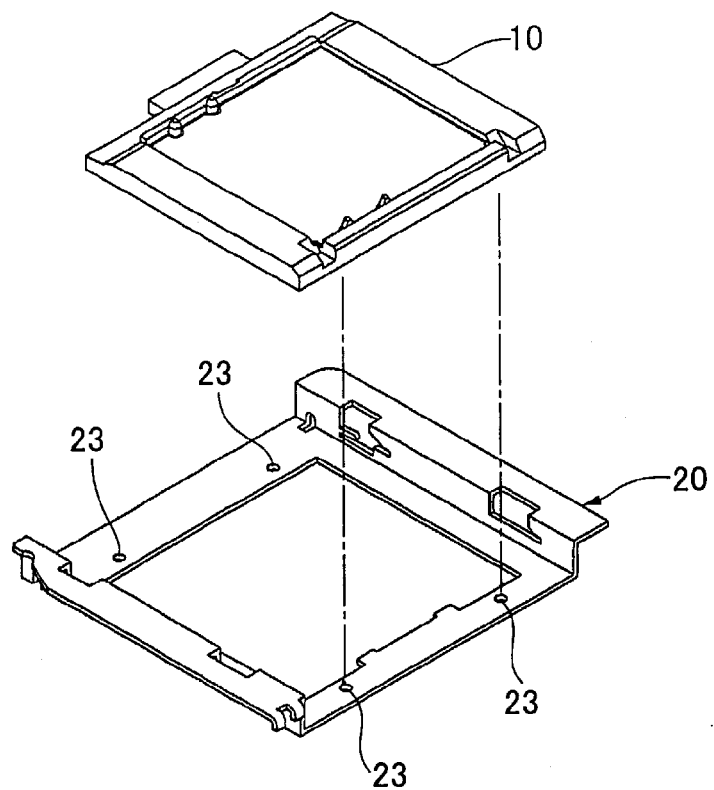
FIGS. 7a and 7b are a partial exploded view and a partial perspective view of the IC socket shown in FIG. 1, respectively, showing the integration of an insulation housing and a load support member.
Figure 7B:
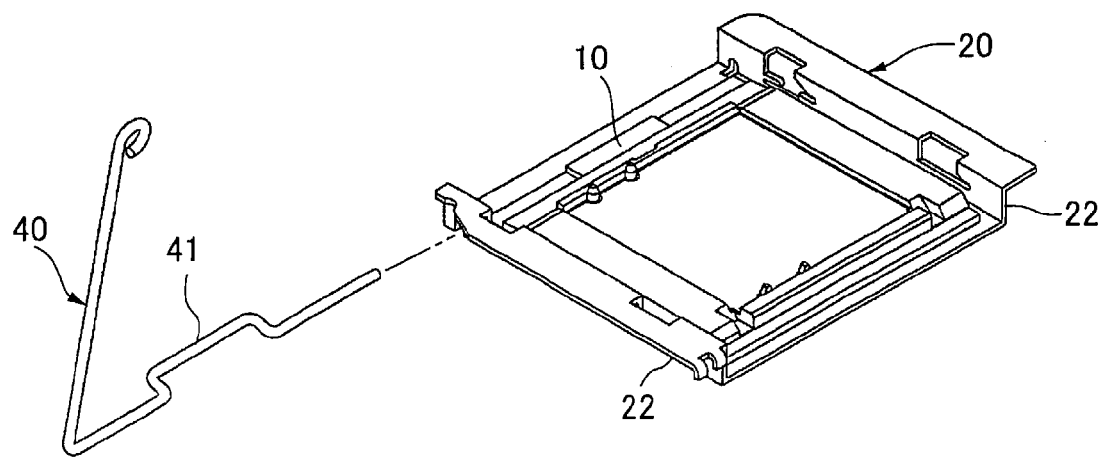

As shown in FIG. 7(a), the insulation housing 10 with the elastic contacts 111 (refer to FIG. 2) and the load support member 20 are prepared, and the four bosses 14 (refer to FIG. 5) provided in the insulation housing 10 are inserted into the four small holes 23 provided in the load support member 20, respectively. Then, the bosses inserted into the small holes 23 are subjected to thermal caulking, whereby the insulation housing 10 and load support member 20 are integrated with each other. In this way, as shown in FIG. 7(b), the load support member 20 integrated with the insulation housing 10 can be obtained. Referring to FIG. 7(b), the insulation housing 10 is shown as being installed between the both sidewalls 22 of the load support member 20. Then, the crankshaft section 41 of the lever 40 is inserted into the lever through hole 223 (refer to FIG. 5) provided in the load support member 20. By manipulating the actuating shaft section 42, the position of the lever 40 inserted into the lever through hole is changed between a raised position in which the actuating shaft section 42 is raised and a lowered position in which the actuating shaft section 42 is lowered.

Finally, the pressure application cover 30 with the guide member 50 installed therein is combined with the load support member 20 having the lever 40 installed therein and having the insulation housing 10 integrated therewith.

Figure 8:
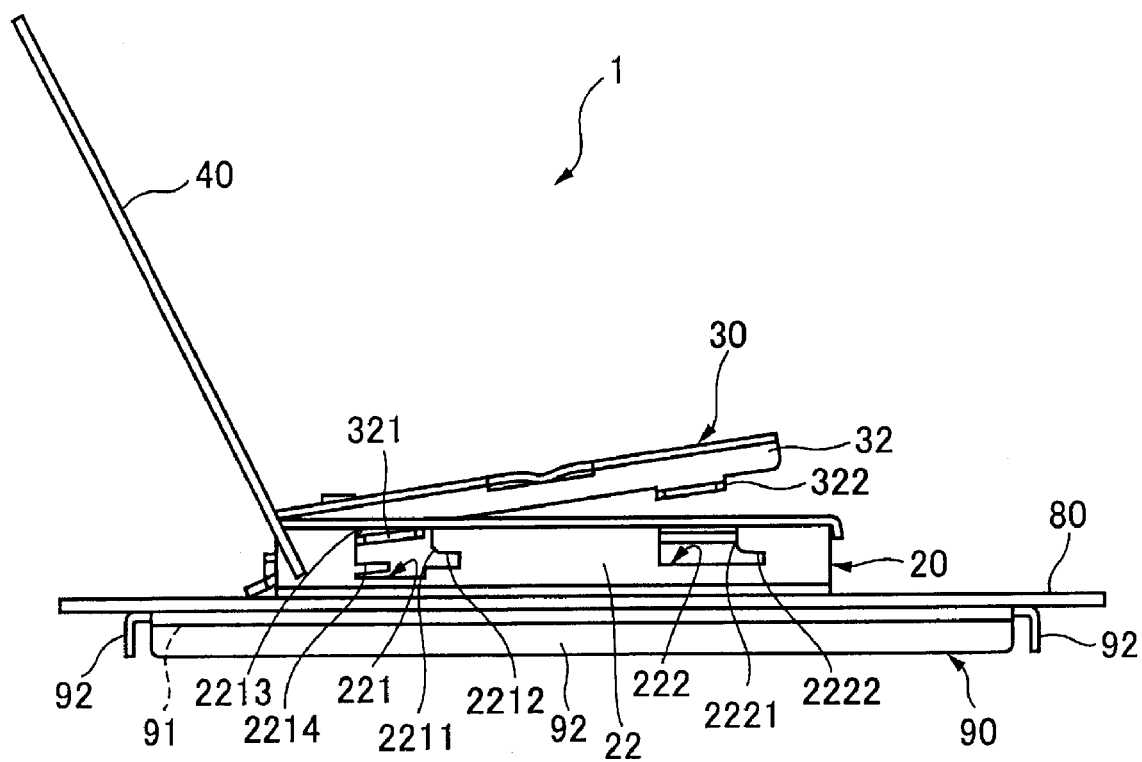
FIG. 8 is a side view of the IC socket shown in FIG. 1 in a state where it is completely assembled and mounted on a circuit substrate.

FIG. 8 is a diagram showing the completely assembled IC socket mounted on a circuit substrate.

In FIG. 8, there is shown a side view of the IC socket 1 with the lever 40 raised. The IC socket 1 is mounted on the circuit substrate 80 by soldering the solder balls 121 shown in FIG. 2 onto the circuit substrate 80. In FIG. 8, there is shown a reinforcement board 90 disposed so as to cover, from the other side, the area where the IC socket 1 is mounted. This reinforcement board 90 can prevent a warpage of the circuit substrate 80 caused when the IC socket 1 is mounted. The reinforcement board 90 shown in FIG. 8, formed by bending a single metal board, includes a rectangular-shaped section 91 contacting a surface opposite to the IC socket 1 mounting surface of the circuit substrate 80, and an enclosure wall section 92 formed by bending the rectangular-shaped section 91 by substantially 90 degrees at each of the four sides thereof.

The first guide grooves 221 positioned in the back side of the both sidewall sections 22 of the load support member 20, and the second guide grooves 222 positioned in the front side of both sidewall sections 22 of the load support member 20 will now be described in detail. In the IC socket 1 shown in FIG. 8, the first guide grooves 221 are shown in the left side; the second guide grooves 222 are shown in the right side. In each of the guide grooves 221 and 222, there are provided cam surfaces 2211 and 2221 sloping obliquely downward from the backside to the front side (from left to right in FIG. 8). The cam surfaces 2211 (the "first cam surfaces" is also used below) provided in the first guide grooves 221 is longer than the cam surfaces 2221 (the "second cam surfaces" is also used below) provided in the second guide grooves 222. Also, the guide grooves 221 and 222 have horizontal surfaces 2212 and 2222 linking to the cam surfaces 2211 and 2221 and extending horizontally from the back side to the front side, respectively. In addition, in the first guide grooves 221 in the left side, there are formed arm sections 2214 extending from the backside wall 2213 to the front side.

The first nails 321 provided in the back side of the side wall sections 32 of the pressure application cover 30 slide along the first cam surfaces 2211 of the first guide grooves 221; the second nails 322 provided in the front side of the pressure application cover 30 slide along the second cam surfaces 2221 of the second guide grooves 222. In the IC socket 1 shown in FIG. 8 with the lever 40 raised, however, while the first nails 321 are inserted into the first guide grooves 221, the second nails 322 are not inserted into the second guide grooves 222, and thus are positioned outside the second guide grooves 222.

Subsequently, a procedure of loading an IC package on the IC socket 1 according to the embodiment will be described.

FIG. 9 is a diagram illustrating the IC socket according to the embodiment immediately before an IC package begins to be loaded.

Figure 9A:
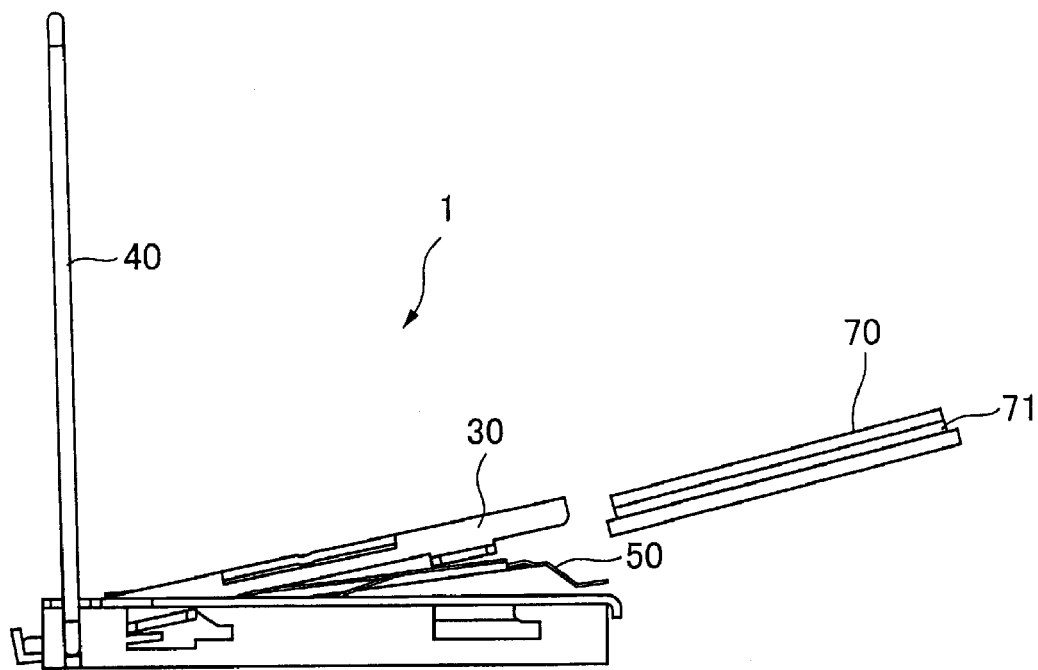
FIGS. 9a and 9b are a side view and a sectional view, respectively, of an IC socket according to an exemplary embodiment of the present invention in a state immediately before an IC package begins to be loaded.
Figure 9B:
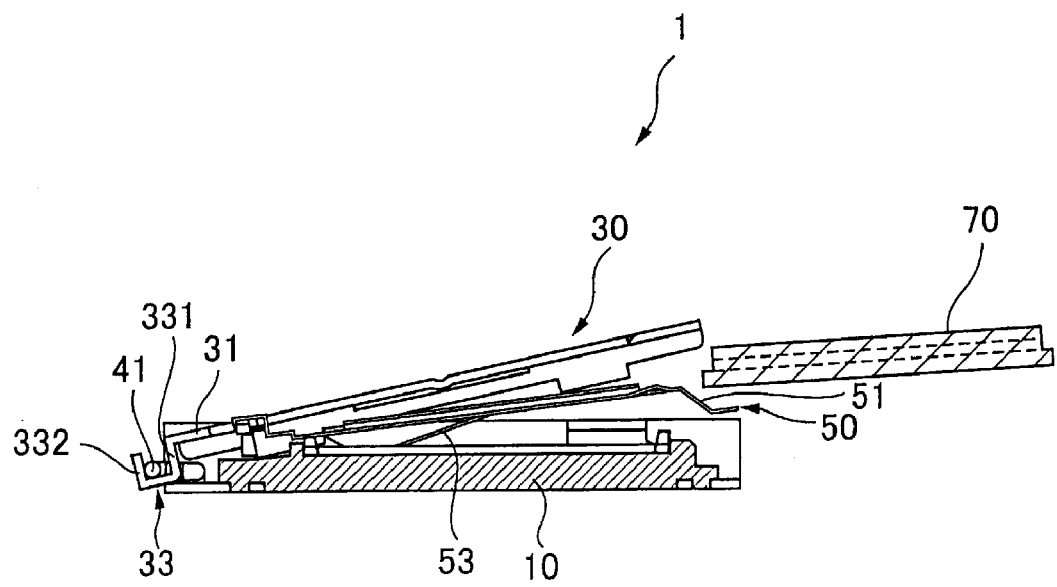

FIG. 9(a) shows a side view of the IC socket 1 with the lever 40 raised, which is the same position as that of the IC socket shown in FIG. 8. FIG. 9(b) shows a cross-sectional view of the IC socket 1 shown in FIG. 9(a) along the depth direction. It is noted that, in the following drawings, the lower side of the drawings corresponds to the circuit substrate side.

As shown in FIG. 9(b), the lever receiving section 33 provided in the pressure application cover 30 is a channel shaped member and has a pushing wall 331 descending from the upper face section 31 of the pressure application cover 30 toward the circuit substrate side, and a release pressure receiving wall 332 positioned opposite the pushing wall 331. The crankshaft section 41 of the lever 40 rotates inside the lever receiving section 33, whereby the insulation housing 10 is not at all interfered with.

In the IC socket 1 with the lever 40 raised, the release pressure receiving wall 332 of the lever receiving section 33 is forced obliquely down-leftward in FIG. 9 by the crankshaft section 41 of the raised lever 40, whereby the pressure application cover 30 holds an oblique position in which the IC package receiving side is raised in a large way. As described later, the pressure application cover 30 has a function of applying load to the IC package to press the pads of the IC package against the elastic contacts 111 shown in FIG. 2. Referring to FIG. 9, however, the pressure application cover 30 applies no load to the IC package; the position of the pressure application cover 30 shown in FIG. 9 corresponds to one example of the no-load position according to the invention.

The guide member 50 engages with the pressure application cover 30 only at a single location in the backside. Thus, as shown in FIG. 9(b), while the pressure application cover 30 contacts the guide member 50 at the engagement location, the distance between the pressure application cover 30 and the guide member 50 increases toward the front side (the right side in FIG. 9). In addition, the receiving section 51 of the guide member 50 slopes so as to distance itself from the pressure application cover 30; therefore the distance therebetween significantly increases in the IC package receiving side. Also, as shown in FIG. 9(b), the tip end of the spring pieces 53 provided in the guide member 50 abuts on the insulation housing 10.

In FIG. 9, there is shown an IC package 70. The IC package 70 shown in FIG. 9 is of LGA type and has groove sections 71 in both ends thereof in the width direction. The IC package 70 is inserted into the IC socket 1 taking the above-described position along the guide rail sections 52 of the guide member 50. The distance between the pressure application cover 30 and the guide member 50 significantly increases in the IC package receiving side so that the IC package 70 can be easily inserted.

Figure 10:
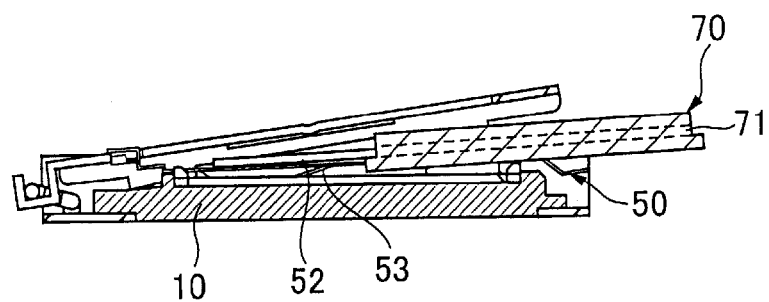
FIG. 10 is a sectional view of the IC socket shown in FIGS. 9a and 9b in a state in which the IC package has begun to be inserted into the IC socket.

FIG. 10 is a cross-sectional view of the IC socket shown in FIG. 9 into which the IC package has begun to be inserted.

The pair of guide rail sections 52 provided in the guide member 50 enters the groove sections 71 of the inserted IC package 70, thus guiding the IC package 70 to the proper position. Thus, with the IC socket 1 of the embodiment, it is possible to prevent the elastic contacts 111 (refer to FIG. 2) and insulation housing 10 from being damaged by improperly loading the IC package 70.

The spring pieces 53 provided in the guide member 50 sag under the weight of the inserted IC package 70, whereby the guide member 50 elastically sinks, thus facilitating the insertion of the IC package 70. In the position shown in FIG. 10, the lever 40 remains raised.

FIG. 11 is a diagram showing the IC socket with the IC package disposed in the proper position.

Figure 11A:
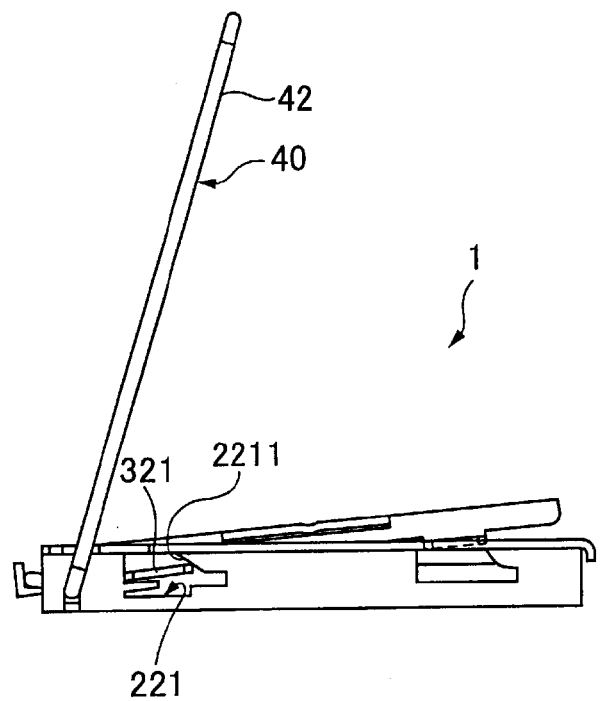
FIGS. 11a and 11b are a side view and a sectional view, respectively, of the IC socket shown in FIGS. 9a and 9b in a state in which the IC package is disposed in the proper position in the IC socket.
Figure 11B:
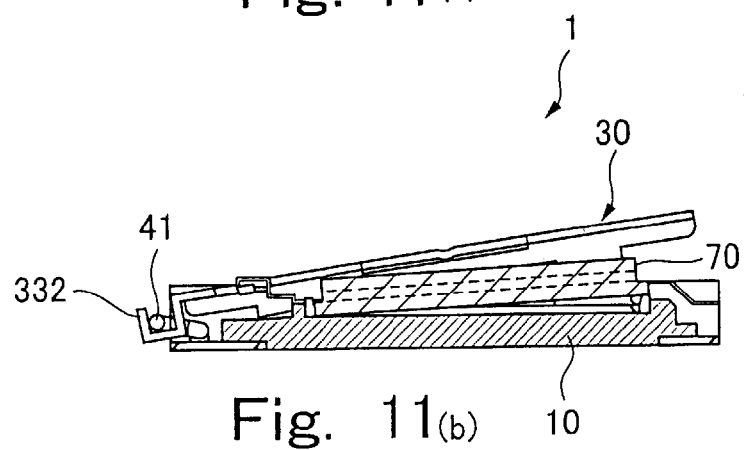

FIG. 11(a) shows a side view of the IC socket 1 with the raised lever shown in FIG. 9 slightly leaned. FIG. 11(b) shows a cross-sectional view of the IC socket 1 shown in FIG. 11(a) along the depth direction.

After the IC package 70 is guided to the proper position, the lever operation is started. The actuating shaft section 42 of the raised lever 40 shown in FIG. 9 is slightly leaned so that the pressure of the crankshaft section 41 against the release pressure receiving wall 332 is reduced, and at the same time the first nails 321 shown in FIG. 11(a) begin to slide along the first cam surfaces 2211 in the first guide grooves 221. The sliding of the first nails 321 causes the pressure application cover 30 to come close to the IC package 70.

Figure 12:
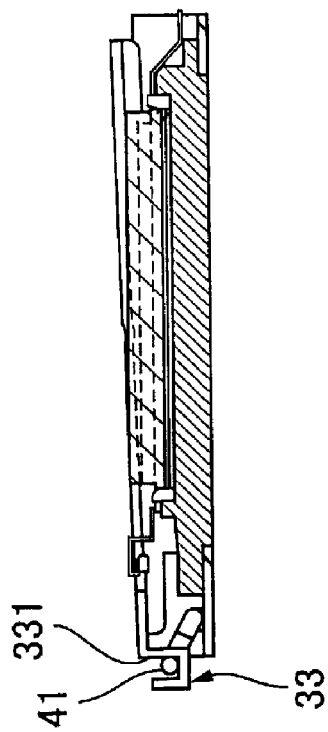
FIGS. 12a and 12b are a side view and a sectional view, respectively of the IC socket shown in FIGS. 9a and 9b in a state in which a lever is partially pivoted closed relative to FIGS. 11a and 11b.
Figure 12:
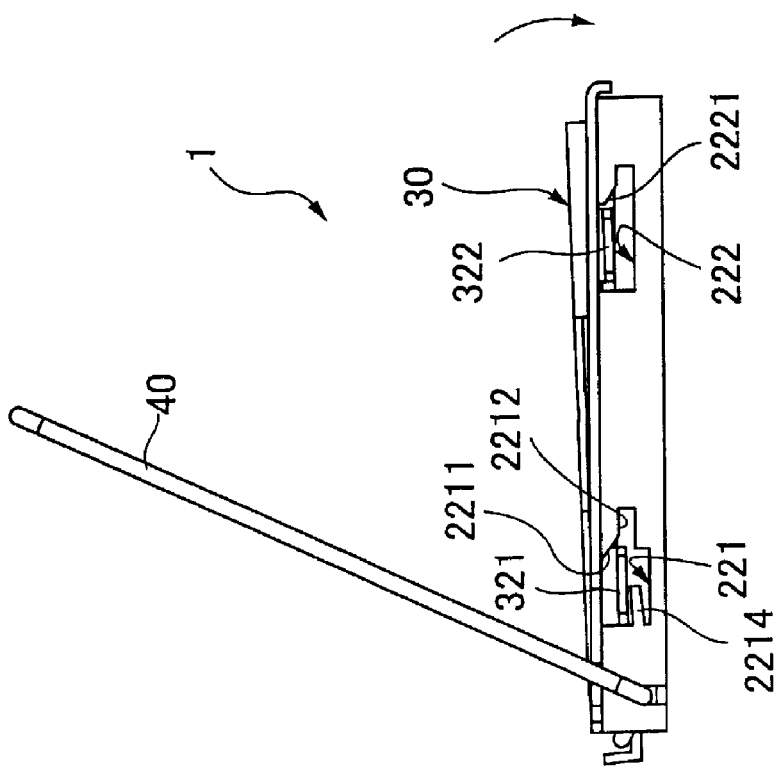

FIG. 12 is a diagram showing the IC socket with the lever leaned further relative to FIG. 11.

FIG. 12(a) shows a side view of the IC socket 1 in which the first nails 321 have finished sliding along the first cam surfaces 2211. FIG. 12(b) shows a cross-sectional view of the IC socket 1 shown in FIG. 12(a) along the depth direction.

As shown in FIG. 12(a), when the lever 40 is further leaned, the first nails 321 finishes sliding along the first cam surfaces 2211. The position of the pressure application cover taken at the time when the first nails 321 finishes sliding along the first cam surfaces 2211 corresponds to one example of the intermediate position according to the invention. At this time, as shown in FIG. 12(b), the pushing wall 331 of the lever receiving section 33 begins to be pushed by the crankshaft section 33 of the lever 40 toward the front side in the depth direction. When the pushing wall 331 begins to be pushed by the crankshaft section 41, the first nails 321 shown in FIG. 12(a) abut on the tip end of the arm sections 2214 formed in the first guide grooves 221, whereby the pressure application cover 30 rotates around the tip end (refer to an arrow in the drawing). As shown in FIG. 12(a), the rotation of the pressure application cover 30 causes the second nails 322 positioned outside the second guide grooves 222 to enter the second guide grooves 222, whereby the second nails 322 begin to slide along the second cam surfaces 2221 in the second guide grooves 222. The sliding of the second nails 322 causes the pressure application cover 30 to come closer to the IC package 70. Also, the first nails 321 slide along the horizontal surfaces 2212 in the first guide grooves 221.

Figure 13:
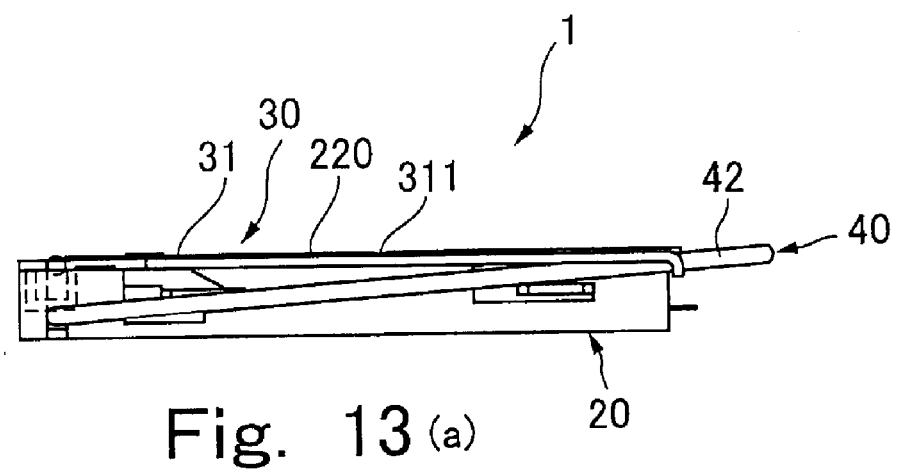
FIGS. 13a, 13b, and 13c are a side view, a side view with the lever omitted, and a sectional view, respectively, of the IC socket shown in FIGS. 9a and 9b in a state in which loading of the IC package is completed.

FIG. 13 is a diagram showing the IC socket having the mounting of the IC package completed.

Figure 13B:
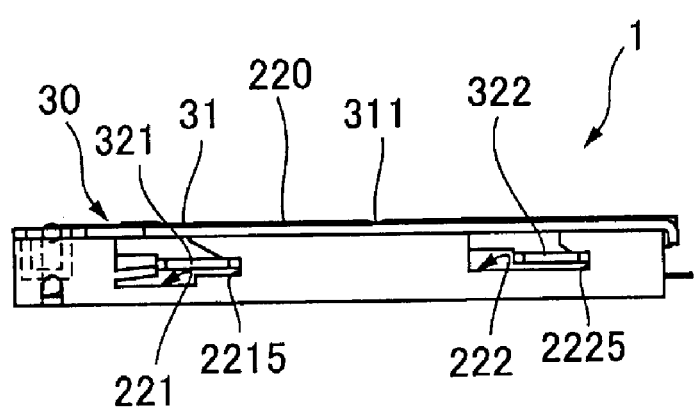
Figure 13C:
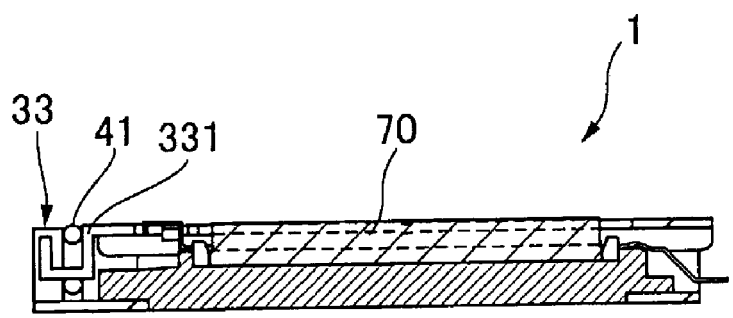

FIG. 13(a) shows a side view of the IC socket 1 with the pads of the IC package 70 pressed by the pressure application cover 30 against the elastic contacts shown in FIG. 2. FIG. 13(b) shows a side view of the IC socket 1 shown in FIG. 13(a) with the actuating shaft section 42 of the lever 40 removed. FIG. 13(c) shows a cross-sectional view of the IC socket 1 shown in FIG. 13(a) along the depth direction.

After leaning the lever 40 to a position in which the actuating shaft section 42 of the lever 40 interferes with the flange section 220 of the load support member 20, the actuating shaft section 42 is once bent outside the flange section 220 by utilizing the spring force of the lever 40, and then is inserted under the flange section 220 and locked in the locking groove 2201 shown in FIG. 1 provided in the flange section 220. In this way, the lever 40 takes the lowered position, and the lowered position of the lever 40 is maintained. With the IC socket 1 according to the embodiment, as shown in Part (c) of FIG. 13, when the lowered position of the lever 40 is maintained, the crankshaft section 41 of the lever 40 continues to press the pushing wall 331 of the lever receiving section 33 toward the front side in the depth direction, and the first nail sections 321 are pressed against the front side walls 2215 of the first guide grooves 221 after sliding along the horizontal surfaces 2212 (refer to FIG. 8) in the first guide grooves 221. After sliding along the second cam surfaces, the second nails 322 also slides along the horizontal surfaces 2222 (refer to FIG. 8) in the second guide grooves 222, and finally are pressed against the front sidewalls 2225 of the second guide grooves 222.

In the IC socket 1 with the lever 40 lowered, the upper face section 31 of the pressure application cover 30 is parallel to the IC package 70, and load is applied to the IC package 70 by the concave sections 311 provided on the upper face section 31 of the pressure application cover 30, so that the pads of the IC package 70 are pressed against the elastic contacts 111 shown in FIG. 2. Consequently, the pads securely keep an electrical contact with the elastic contacts. Thus, the position of the pressure application cover 30 shown in FIG. 13 corresponds to one example of the load position according to the invention.

As described above, with the IC socket 1 according to the embodiment, by performing only the lever manipulation to lower the raised lever 40, the first nail sections 321 slide along the first cam surfaces 2211, and then the second nail sections 322 slide along the second cam surfaces 2221, whereby the position of the pressure application cover 30 can be shifted from the no-load position to the load position.

Accordingly, with the IC socket 1 according to the embodiment, the IC package 70 can be loaded with a small number of operations. Also, in order to remove the IC package 70 from the IC socket 1 with the IC package 70 loaded thereon, a user only needs to perform a lever manipulation to raise the lowered lever 40.

In addition, with the IC socket 1 according to the embodiment, the insulation housing 10 is disposed off the rotation range of the crankshaft section 41 of the lever 40, which prevents the crankshaft section 41 from applying load to the insulation housing 10, thus making it possible to change the position of the pressure application cover 30 with a small actuating power.

In the IC socket 1 according to the embodiment, two separate independent cam surfaces, i.e. the first cam surface 2211 and second cam surface 2221, are provided, so that the cam operation is divided into two steps, thereby preventing the cam mechanism from getting bigger while securing a sufficient stroke of the cam surfaces. However, the first cam surface 2211 and second cam surface 2221 may be combined to make a single cam surface, or alternatively may be divided into three or more cam surfaces. Also, the IC socket 1 according to the embodiment is a socket for IC package of LGA type; the invention, however, can also be applied to a socket for IC package of BGA (Ball Grid Array) type.

Figure 14:
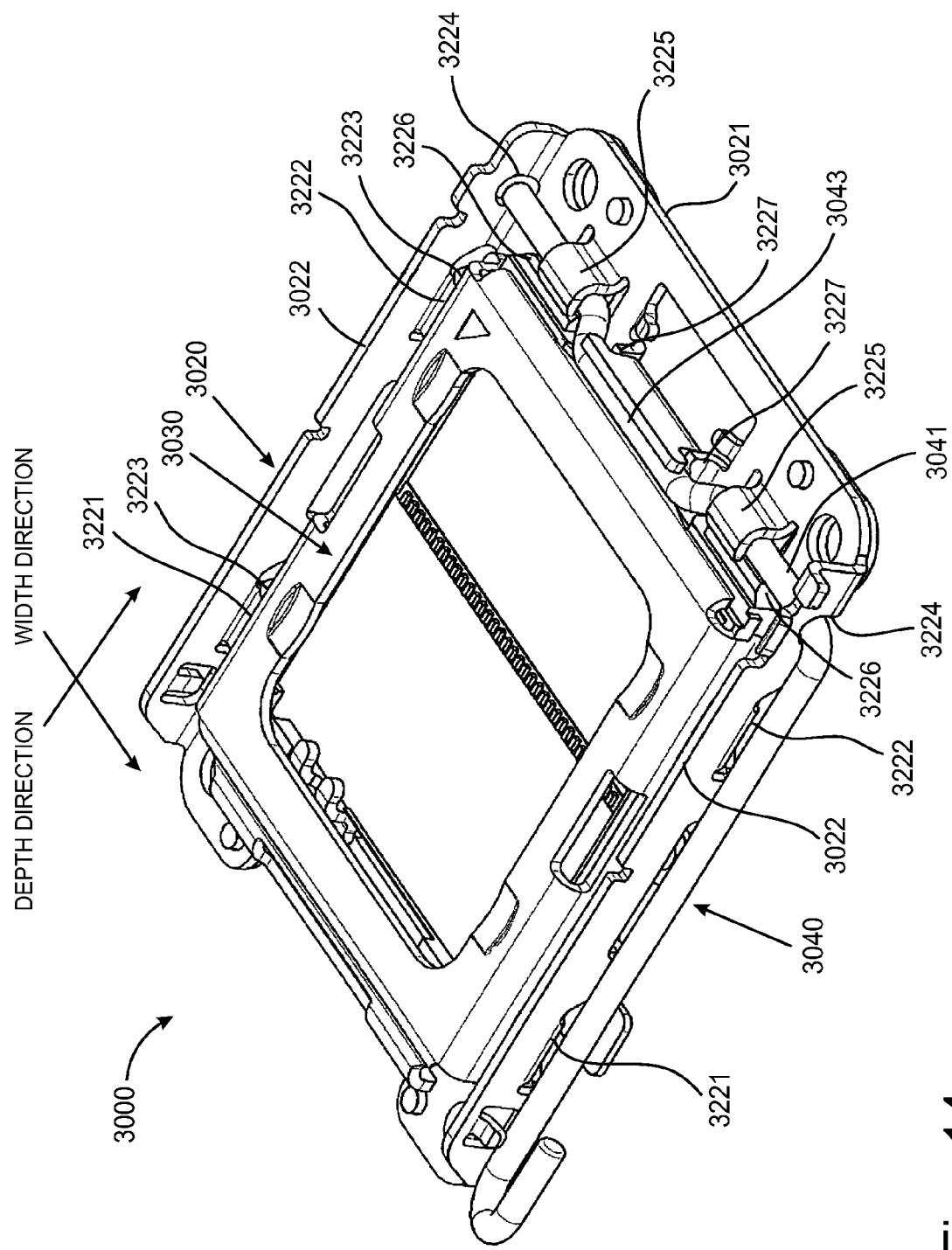
FIG. 14 is an oblique view of an IC socket according to an alternative embodiment and shown in an open position.
Figure 15:
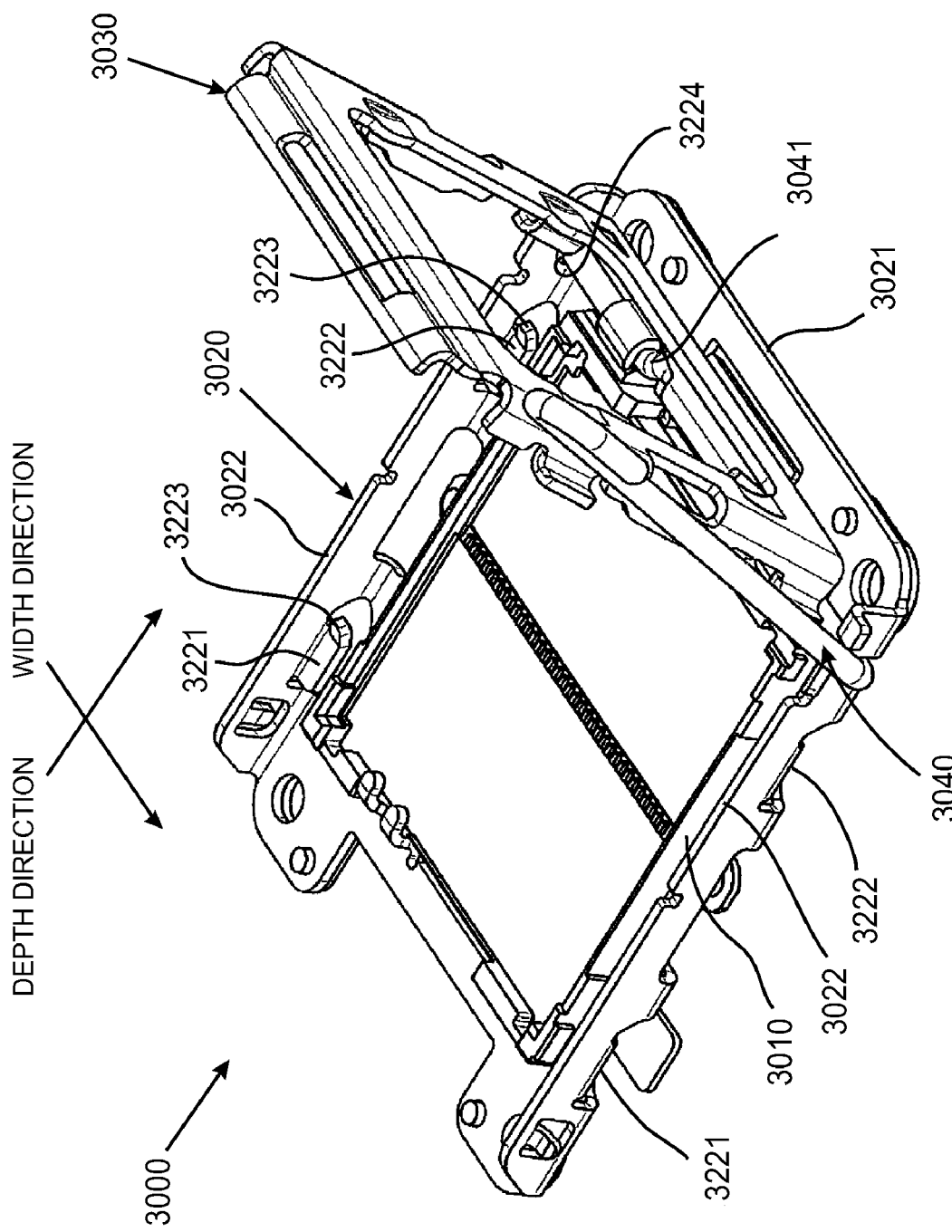
FIG. 15 is an oblique view of the IC socket of FIG. 14 and shown in a closed position.

Referring now to FIGS. 14 and 15, an IC socket 3000 according to an alternative embodiment of the present invention is shown. Specifically, IC socket 3000 is shown in a closed or load position in FIG. 14 and in an open or no-load position in FIG. 15. Operation of IC socket 3000 is substantially similar to the operation of IC socket 1, with primary differences being related to the mechanisms for the relative movement between a load support member 3020, a pressure application cover 3030, and a lever 3040 of the IC socket 3000 as compared to the mechanisms for the relative movement between the load support member 20, pressure application cover 30, and lever 40 of IC socket 1. IC socket 3000 further comprises an insulative housing 3010 substantially similar to insulative housing 10.

IC socket 3000 comprises a load support member 3020 that may be formed by punching and bending a metal sheet. The load support member 3020 comprises a base section 3021 and sidewalls 3022. The sidewalls 3022 are provided at both ends of the base section 3021 in the width direction, respectively. Specifically, the sidewalls 3022 rise from the base section 3021 and extend in the depth direction. The sidewalls 3022 are provided with first guide tabs 3221 and second guide tabs 3222 positioned in parallel with each other. Guide tabs 3221 and 3222 extend generally inward from the sidewalls 3022 and are oriented generally parallel to the base section 3021. Guide tabs 3221 and 3222 each comprise a cammed portion 3223 that inclines upward and away from the remainder of the guide tabs 3221 and 3222. Lever clearance apertures 3224 are provided on load support member 3020 and are generally coaxially aligned with portions of a crankshaft section 3041 of lever 3040 which would, without provision of lever clearance apertures 3224, interfere with the sidewalls 3022. With the provision of lever clearance apertures 3224, the lever 3040 is free to be operated without the crankshaft section 3041 being supported by the sidewalls 3022. Instead, the portions of the crankshaft section 3041 that are coaxial with lever clearance apertures 3224 are captured between lever crankshaft retainers 3225 at the top and rear, base section 3021 at the bottom, and keeper walls 3226 of insulative housing 3010 at the front.

Lever crankshaft retainers 3225 are shown as substantially hook-like protrusions extending from the base section 3021. Lever crankshaft retainers 3225 may be formed by perforating the base section 3021 and subsequently bending a portion of base section 3021 into the proper shape. However, lever crankshaft retainers 3225 may be formed as solid protrusion molded, welded, adhered, or otherwise connected to the base section 3021. It will be appreciated that the lever crankshaft retainers 3225 are displaced an offset distance from the nearest end of the base section 3021 in the depth direction.

Base section 3021 further comprises lever guide tabs 3227 that are shown as substantially upright walls extending from the base section 3021 and running along the depth direction. Lever guide tabs 3227 are located below a crankshaft central portion 3043 that, upon rotation of the lever 3040, cause movement of pressure application cover 3030. With the crankshaft central portion 3043 being non-coaxial with the remainder of the crankshaft 3041, a cam action is provided which may be used to cause first nails 3321 and second nails 3322 of pressure application cover 3030 to engage and slide below guide tabs 3221 and 3222, respectively. With the first and second nails 3221, 3222 below guide tabs, as shown in FIG. 14, pressure application cover 3030 may apply pressure to a pad of an IC package (not shown).

Further, it will be appreciated that other embodiments of the present invention may include elements disclosed in the embodiment disclosed in FIGS. 1-13b in combination with elements disclosed in the embodiment disclosed in FIGS. 14 and 15. Specifically, another alternative embodiment may include a load support member comprising lever crankshaft retainers 3225 and also include sidewalls 22 with first guide grooves 221 and second guide grooves 222.

What is claimed is:

1. An integrated circuit (IC) socket with an insulation housing which has a mounting surface mounting the lower face of an IC package, and has disposed therein a plurality of elastic contacts electrically connected to a substrate and provided corresponding to a plurality of pads of the IC package, the IC package having the plurality of pads disposed in a matrix manner on the lower face thereof, the IC socket comprising:
   a load support member having a base section attached on a bottom face side of the insulation housing, and both sidewalls rising from the base section along opposing sidewalls of the insulation housing and each provided with a guide groove with a cam surface;
   a pressure application cover positioned on an upper face side of the IC package, having a nail section sliding along the cam surface in the guide groove and changing in position between a load position which applies load to the IC package to thereby press the pads against the elastic contacts and a no-load position which applies no load to the IC package; and
   a lever rotatably supported on the both sidewalls of the load support member, including a crankshaft section which causes the nail section to slide along the cam surface in the guide groove to thereby cause the pressure application cover to change in position between the load position and the no-load position, and an actuating shaft section substantially orthogonal to the crankshaft section.

2. The IC socket according to claim 1, wherein:
   when changing in position between the load position and no-load position, the pressure application cover goes through a predetermined intermediate position to change position;
   the guide groove provided in each of the both sidewalls of the load support member comprises a first guide groove having a first cam surface, and a second guide groove having a second cam surface; and
   the nail section comprises a first nail section which slides along the first cam surface in the first guide groove when the pressure application cover changes in position between the no-load position and intermediate position, and a second nail section which slides along the second cam surface in the second guide groove when the pressure application cover changes in position between the intermediate position and load position.

3. The IC socket according to claim 1, comprising a guide member disposed between the insulation housing and the pressure application cover and having a pair of guide rails which guide the IC package.

4. The IC socket according to claim 2, comprising a guide member disposed between the insulation housing and the pressure application cover and having a pair of guide rails which guide the IC package.

5. An integrated circuit (IC) socket comprising:
   an insulation housing having an IC package mounting surface;
   a plurality of electrical contacts electrically connected to a substrate and corresponding to a plurality of pads of the IC package;
   a load support member having a base section attached on a first side of the insulation housing, sidewalls extending from the base section along opposing sidewalls of the insulation housing;
   a guide groove having a cam surface located on each of the load support member sidewalls;
   a pressure application cover positioned over the IC package, having a nail section sliding along the cam surface in the guide groove and changing in position between a load position which applies load to the IC package to thereby press the pads against the electrical contacts and a no-load position which applies no load to the IC package; and
   a lever rotatably supported on the both sidewalls of the load support member, including a crankshaft section which causes the nail section to slide along the cam surface in the guide groove between the load position and the no-load position.

6. The IC socket of claim 5 wherein the guide groove provided in each of the sidewalls of the load support member comprises a first guide groove having a first cam surface, and a second guide groove having a second cam surface.

7. The IC socket of claim 6 wherein the nail section comprises a first nail section which slides along the first cam surface in the first guide groove when the pressure application cover changes in position between the no-load position and an intermediate position, and a second nail section which slides along the second cam surface in the second guide groove when the pressure application cover changes in position between the intermediate position and load position.

8. The IC socket according to claim 5, comprising a guide member disposed between the insulation housing and the pressure application cover and having a pair of guide rails which guide the IC package.

9. The IC socket according to claim 7, comprising a guide member disposed between the insulation housing and the pressure application cover and having a pair of guide rails which guide the IC package.

10. An integrated circuit (IC) socket with an insulation housing which has a mounting surface mounting the lower face of an IC package, and has disposed therein a plurality of elastic contacts electrically connected to a substrate and provided corresponding to a plurality of pads of the IC package, the IC package having the plurality of pads disposed in a matrix manner on the lower face thereof, the IC socket comprising:

a load support member having a base section attached on a bottom face side of the insulation housing, and both sidewalls rising from the base section along opposing sidewalls of the insulation housing and each provided with a guide groove with a cam surface;

a pressure application cover positioned on an upper face side of the IC package, having a nail section sliding along the cam surface in the guide groove and changing in position between a load position which applies load to the IC package to thereby press the pads against the elastic contacts and a no-load position which applies no load to the IC package; and a lever rotatably supported on at least one of the sidewalls of the load support member, including a crankshaft section which causes the nail section to slide along the cam surface in the guide groove to thereby cause the pressure application cover to change in position between the load position and the no-load position, and an actuating shaft section substantially orthogonal to the crankshaft section.

11. The IC socket according to claim 10, wherein:
when changing in position between the load position and no-load position, the pressure application cover goes through a predetermined intermediate position to change position;
the guide groove provided in each of the both sidewalls of the load support member comprises a first guide groove having a first cam surface, and a second guide groove having a second cam surface; and
the nail section comprises a first nail section which slides along the first cam surface in the first guide groove when the pressure application cover changes in position between the no-load position and intermediate position, and a second nail section which slides along the second cam surface in the second guide groove when the pressure application cover changes in position between the intermediate position and load position.

12. The IC socket according to claim 10, comprising a guide member disposed between the insulation housing and the pressure application cover and having a pair of guide rails which guide the IC package.

13. The IC socket according to claim 11, comprising a guide member disposed between the insulation housing and the pressure application cover and having a pair of guide rails which guide the IC package.

14. An integrated circuit (IC) socket comprising:
an insulation housing having an IC package mounting surface;
a plurality of electrical contacts electrically connected to a substrate and corresponding to a plurality of pads of the IC package;
a load support member having a base section attached on a first side of the insulation housing, sidewalls extending from the base section along opposing sidewalls of the insulation housing;
a guide groove having a cam surface located on each of the load support member sidewalls;
a pressure application cover positioned over the IC package, having a nail section sliding along the cam surface in the guide groove and changing in position between a load position which applies load to the IC package to thereby press the pads against the electrical contacts and a no-load position which applies no load to the IC package; and a lever rotatably supported on at least one of the sidewalls of the load support member, including a crankshaft section which causes the nail section to slide along the cam surface in the guide groove between the load position and the no-load position.

15. The IC socket of claim 14 wherein the guide groove provided in each of the sidewalls of the load support member comprises a first guide groove having a first cam surface, and a second guide groove having a second cam surface.

16. The IC socket of claim 15 wherein the nail section comprises a first nail section which slides along the first cam surface in the first guide groove when the pressure application cover changes in position between the no-load position and an intermediate position, and a second nail section which slides along the second cam surface in the second guide groove when the pressure application cover changes in position between the intermediate position and load position.

17. The IC socket according to claim 14, comprising a guide member disposed between the insulation housing and the pressure application cover and having a pair of guide rails which guide the IC package.

18. The IC socket according to claim 16, comprising a guide member disposed between the insulation housing and the pressure application cover and having a pair of guide rails which guide the IC package.

19. An integrated circuit (IC) socket comprising:
an insulation housing having an IC package mounting surface;
a plurality of electrical contacts electrically connected to a substrate and corresponding to a plurality of pads of the IC package;
a load support member having a base section attached on a first side of the insulation housing, sidewalls extending from the base section along opposing sidewalls of the insulation housing;
a guide groove having a cam surface located on each of the load support member sidewalls;
a pressure application cover positioned over the IC package, having a nail section sliding along the cam surface in the guide groove and changing in position between a load position which applies load to the IC package to thereby press the pads against the electrical contacts and a no-load position which applies no load to the IC package; and
a lever rotatably supported on the load support member, including a crankshaft section which causes the nail section to slide along the cam surface in the guide groove between the load position and the no-load position.

20. An integrated circuit (IC) socket with an insulation housing which has a mounting surface mounting the lower face of an IC package, and has disposed therein a plurality of elastic contacts electrically connected to a substrate and provided corresponding to a plurality of pads of the IC package, the IC package having the plurality of pads disposed in a matrix manner on the lower face thereof, the IC socket comprising:

a load support member having a base section attached on a bottom face side of the insulation housing, and both sidewalls rising from the base section along opposing sidewalls of the insulation housing, at least one of the sidewalls having a cammed portion;

a pressure application cover positioned on an upper face side of the IC package, having a nail section sliding along the cammed portion and changing in position between a load position which applies load to the IC package to thereby press the pads against the elastic contacts and a no-load position which applies no load to the IC package; and a lever rotatably supported on the load support member, including a crankshaft section which causes the nail section to slide along the cammed portion to thereby cause the pressure application cover to change in position between the load position and the no-load position.

21. The integrated circuit (IC) socket according to claim 20, further comprising:

a lever guide tab located below a crankshaft central portion.

22. The integrated circuit (IC) socket according to claim 20, wherein the cammed portion protrudes generally inward from the sidewall.

23. The integrated circuit (IC) socket according to claim 20, wherein the lever is retained at least in part by a lever crankshaft retainer.

24. The integrated circuit (IC) socket according to claim 20, wherein the lever is retained at least in part by a keeper wall of the insulation housing.

25. The IC socket according to claim 20, wherein:

when changing in position between the load position and no-load position, the pressure application cover goes through a predetermined intermediate position to change position.

26. The IC socket according to claim 20, comprising a guide member disposed between the insulation housing and the pressure application cover and having a pair of guide rails which guide the IC package.

* * * * *